(12) United States Patent
Mori et al.

(10) Patent No.: US 8,257,504 B2
(45) Date of Patent: Sep. 4, 2012

(54) SURFACE TREATMENT COMPOSITION, SURFACE TREATMENT METHOD, AND METHOD FOR MANUFACTURING SEMICONDUCTOR DEVICE

(75) Inventors: Yasumasa Mori, Tokyo (JP); Hirotaka Shida, Tokyo (JP); Kazuo Kawaguchi, Tokyo (JP); Hiroyuki Yano, Yokohama (JP); Mie Matsuo, Kamakura (JP)

(73) Assignees: JSR Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 139 days.

(21) Appl. No.: 12/794,028

(22) Filed: Jun. 4, 2010

(65) Prior Publication Data

US 2010/0311630 A1 Dec. 9, 2010

(30) Foreign Application Priority Data

Jun. 5, 2009 (JP) ................................. 2009-136098

(51) Int. Cl.
*C25F 3/30* (2006.01)
(52) U.S. Cl. ........................... 134/1.3; 510/175; 134/1.2
(58) Field of Classification Search .................. 510/175; 134/1.2, 1.3
See application file for complete search history.

(56) References Cited

U.S. PATENT DOCUMENTS

| 6,527,622 | B1 | 3/2003 | Brusic et al. |
| 7,097,541 | B2 * | 8/2006 | DeRege Thesauro et al. .. 451/36 |
| 2006/0030158 | A1 * | 2/2006 | Carter et al. .................. 438/692 |
| 2007/0181535 | A1 | 8/2007 | Derege Thesauro et al. |
| 2010/0155654 | A1 | 6/2010 | Etoh et al. |

FOREIGN PATENT DOCUMENTS

| JP | 2004-123950 | 4/2004 |
| JP | 2004-335689 | 11/2004 |
| JP | 2006-519490 | 8/2006 |
| JP | 2007-291505 | 11/2007 |
| JP | 2009-510723 | 3/2009 |
| WO | WO 2007/108215 A1 | 9/2007 |

* cited by examiner

*Primary Examiner* — Charles Boyer
(74) *Attorney, Agent, or Firm* — Oblon, Spivak, McClelland, Maier & Neustadt, L.L.P.

(57) ABSTRACT

A surface treatment composition of this invention is a composition for treating a metal wiring-including surface of a semiconductor substrate, which includes a compound (A) represented by a specific structural formula and a solvent (B) having a boiling point at one atmospheric pressure of 50 to 300° C., and has a pH of 4 to 11.

According to the surface treatment composition of the present invention, oxidation of metal wiring of a semiconductor substrate can be suppressed and deterioration of the flatness of the metal wiring portion due to unusual oxidation can be suppressed. Furthermore, when an insulating film or a barrier metal film is present on a metal wiring-including surface of the semiconductor substrate, fang and surface roughness of the metal wiring occurring in the interface between the metal wiring and the insulating film or the barrier metal film can be suppressed.

13 Claims, 1 Drawing Sheet

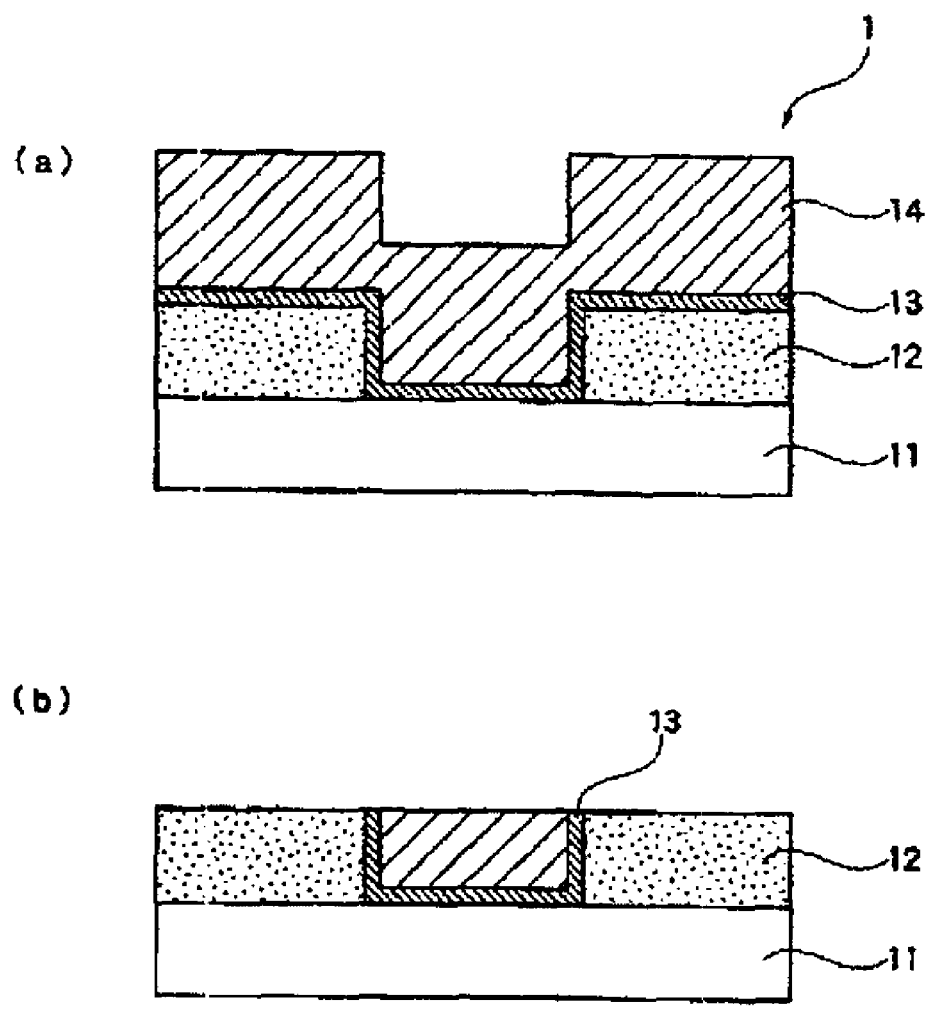

SURFACE TREATMENT COMPOSITION, SURFACE TREATMENT METHOD, AND METHOD FOR MANUFACTURING SEMICONDUCTOR DEVICE

BACKGROUND OF THE INVENTION

1. Field of the Invention

The present invention relates to a surface treatment composition for treating a metal wiring-including surface of a semiconductor substrate, a surface treatment method, and a method for manufacturing a semiconductor device.

2. Description of the Related Art

With an increase in the integration of semiconductor devices, a semiconductor device manufacturing process has become complicated. In such a complicated semiconductor device manufacturing process, a semiconductor substrate may be exposed to an oxygen-containing atmosphere during a period after chemical mechanical polishing and before the following process. In such a case, when a semiconductor substrate surface has a metal wiring portion of copper or the like, the metal wiring portion is oxidized. It has been known that when the metal wiring portion is oxidized, the electrical properties of a semiconductor device to be obtained deteriorate.

Examples of methods for suppressing oxidation of metal wiring portions include a method including holding a semiconductor substrate in inactive gas or the like during a period after chemical mechanical polishing and before the following process. In former techniques, oxidation of metal wiring is required to be suppressed by performing such a strict process control.

When the metal wiring portion is a copper wiring portion, a convex-shaped unusual-oxidation portion having the height of 10 to 50 nm generates in the copper wiring portion to deteriorate the flatness of the wiring portion, resulting in a problem of reduced yields. Therefore, techniques for suppressing the oxidation of metal wiring portions of copper or the like by a simple method have been demanded.

As the method for suppressing oxidation of a copper wiring portion, a method for suppressing the oxidation-reduction potential of a treatment agent to be used in a surface treatment process of a surface to be polished after chemical mechanical polishing has been proposed (e.g., Patent Document 1)
Patent document 1: JP-A 2007-291505.

SUMMARY OF THE INVENTION

However, according to the method of Patent Document 1, although oxidation can be suppressed due to the effects of the treatment agent in the surface treatment process, it has been difficult to suppress oxidation of a copper wiring portion in a standby process before the following process after chemical mechanical polishing. Moreover, in some cases, another process for removing the treatment agent that has left as a residue after the surface treatment has been separately required. Moreover, the performance of the ethanolamine-based treatment agent used in Examples of Patent Document 1 is extremely low.

The present invention has been made in order to solve the above-described problems. It is an object of the present invention to provide a surface treatment composition for suppressing oxidation of metal wiring of a semiconductor substrate and suppressing deterioration of the flatness of the metal wiring portion due to unusual oxidation. Furthermore, when an insulating film or a barrier metal film is present on a metal wiring-including surface of a semiconductor substrate, it is an object of the present invention to provide a surface treatment composition for suppressing wedge-shaped defects (hereinafter also referred to as "fang") or surface roughness of the metal wiring occurring in an interface between the metal wiring and the insulating film or the barrier metal film.

Moreover, it is an object of the present invention to provide a surface treatment method that can demonstrate the above-described effects and a method for manufacturing a semiconductor device including a treatment process by the surface treatment method.

The present inventors have conducted extensive researches, and, as a result, have found that when a surface treatment composition comprising a specific compound and a specific solvent and having a pH in a specific range is used, oxidation of metal wiring of a semiconductor substrate is favorably suppressed, and thus deterioration of the flatness of a metal wiring portion due to unusual oxidation can be suppressed. Furthermore, when an insulating film or a barrier metal film is present on a metal wiring-including surface of the semiconductor substrate, fang and surface roughness of the metal wiring occurring in the interface between the metal wiring and the insulating film or the barrier metal film can be suppressed. Thus, the present invention has been accomplished.

More specifically, the surface treatment composition of the present invention is a composition for treating a metal wiring-including surface of a semiconductor substrate, which comprises a compound (A) represented by the following Formula (1) and a solvent (B) having a boiling point at one atmospheric pressure of 50 to 300° C., and has a pH of 4 to 11,

(1)

wherein, in Formula (1), Rs each independently represent an alkyl group, an aryl group, an alkoxy group, an amino group, an aminoalkyl group, a hydroxy group, a hydroxyalkyl group, a carboxy group, a carboxyalkyl group, a carbamoyl group, or an aldehyde group and m is an integer of 0 to 4.

It is preferable for the surface treatment composition to further contain organic resin particles. Moreover, the solvent (B) is preferably water.

The surface treatment method of the present invention is a method comprising bringing the surface treatment composition into contact with a metal wiring-including surface of a semiconductor substrate to treat the metal wiring-including surface of the semiconductor substrate.

The method for manufacturing a semiconductor device of the present invention is a manufacturing method comprising a process for treating a metal wiring-including surface of a semiconductor substrate by the surface treatment method.

According to the surface treatment composition of the present invention, oxidation of metal wiring of a semiconductor substrate can be suppressed and deterioration of the flatness of the metal wiring portion due to unusual oxidation can be suppressed. Furthermore, when an insulating film or a barrier metal film is present on a metal wiring-including surface of the semiconductor substrate, fang and surface roughness of the metal wiring occurring in the interface between the metal wiring and the insulating film or the barrier metal film can be suppressed. Moreover, according to the surface treatment method of the present invention, since oxidation of the metal wiring of the semiconductor substrate can be suppressed, a reduction process in the following process can be considerably facilitated. Therefore, according to the method for manufacturing a semiconductor device including the treatment process by the surface treatment method of the present invention, semiconductor devices can be manufactured while saving the cost. Moreover, according to the method for manufacturing a semiconductor device comprising the process for treating a metal wiring-including surface of a semiconductor substrate by the surface treatment method of the present invention, deterioration of the flatness of the metal wiring portion due to unusual oxidation can be suppressed. Furthermore, when an insulating film or a barrier metal film is present on the metal wiring-including surface of the semiconductor substrate, fang and surface roughness of the metal wiring occurring in the interface between the metal wiring and the insulating film or the barrier metal film can be suppressed, and thus semiconductor devices to be obtained by the manufacturing method have excellent electrical properties.

BRIEF DESCRIPTION OF THE DRAWINGS

FIG. 1 is a cross sectional view showing one example of a semiconductor substrate to be treated by the present invention. FIG. 1(a) is a cross sectional view showing one example of the semiconductor substrate before chemical mechanical polishing. FIG. 1(b) is a cross sectional view showing one example of the semiconductor substrate before surface treatment.

| 1 | Semiconductor substrate material |
| 11 | Base (e.g., silicon) |
| 12 | Insulating film (e.g., PETEOS) |
| 13 | Barrier metal film |
| 14 | Metal film |

DESCRIPTION OF THE PREFERRED EMBODIMENTS

Hereinafter, preferable embodiments of the present invention will be described in detail.
[1. Surface Treatment Composition]
The surface treatment composition of the present invention is a composition for treating a metal wiring-including surface of a semiconductor substrate, which comprises a compound (A) represented by the following Formula (1) (hereinafter also referred to as a "compound (A)") and a solvent (B) having a boiling point at one atmospheric pressure of 50 to 300° C. (hereinafter also referred to as "solvent (B)"), and has a pH of 4 to 11.
<Compound (A)>

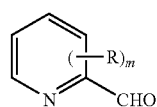

(1)

In Formula (1), Rs each independently represent an alkyl group, an aryl group, an alkoxy group, an amino group, an aminoalkyl group, a hydroxy group, a hydroxyalkyl group, a carboxy group, a carboxyalkyl group, a carbamoyl group, or an aldehyde group and m is an integer of 0 to 4.

The alkyl group may be a straight chain group or may have a side chain. Examples of the alkyl group include a methyl group, an ethyl group, an n-propyl group, an i-propyl group, an n-butyl group, an i-butyl group, a sec-butyl group, a t-butyl group, a pentyl group, an isopentyl group, a neopentyl group, a hexyl group, a heptyl group, an octyl group, and a 2-ethylhexyl group.

Examples of the compound (A) include compounds, such as pyridine aldehydes, such as 2-pyridinecarboxyaldehyde, 6-methyl-2-pyridinecarboxyaldehyde, 2,6-pyridinedicarboxyaldehyde, 6-amino-2-pyridinecarboxyaldehyde, and 6-hydroxy-2-pyridinecarboxyaldehyde. Among the above, 2-pyridinecarboxyaldehyde, 2,6-pyridinedicarboxyaldehyde, and 6-amino-2-pyridinecarboxyaldehyde that can be easily coordinated to metal atoms, such as copper, are preferable, 2-pyridinecarboxyaldehyde and 2,6-pyridinedicarboxyaldehyde are more preferable, and 2-pyridinecarboxyaldehyde is particularly preferable. The compounds (A) can be used singly or as a mixture of two or more thereof.

Since the surface treatment composition of the present invention contains such a compound (A), unusual oxidation in metal wiring can be prevented.

Since the compound (A) has a nitrogen-containing heterocyclic compound skeleton, the coordination ability to a metal atom having the d-electron orbital, such as copper, tungsten, ruthenium, cobalt, tin, and nickel. Thus, the compound (A) is expected to effectively adsorb to the surface of such metals or oxides thereof. As a result, the aldehyde group present in the same molecule of the compound (A) and the metal oxide surface serving as a reduction target can be brought physically close to each other. Therefore, even when the content of the compound (A) is low, it is estimated that the reduction ability by the aldehyde group can be effectively acted. Moreover, it is considered that since the nitrogen-containing heterocyclic compound skeleton can be easily coordinated to impurity metal ions on metal wiring and stabilized, the action of dissolving the polluted metal surface to remove the same is also excellent.

The compound (A) has an aldehyde group on the carbon atom adjacent to the nitrogen atom contained in the heterocyclic ring. Thus, when the nitrogen atom in the molecule becomes an adsorbing point to the surface of metal or a metal oxide, the treatment surface and an aldehyde site can be brought close to each other. Therefore, the reduction ability of the aldehyde can be more effectively acted. The number of the carbon atoms that are adjacent to the nitrogen atom contained in the heterocyclic ring and have an aldehyde group may be two. Considering the oxidation-reduction properties of metals and coordination stability to metal ions, it is considered that the effects are demonstrated particularly when the target metal is copper, tungsten, ruthenium, cobalt, tin, nickel, or an alloy thereof.

Moreover, since the compound (A) is easily evaporated (sublimation) by heating as described later, the compound (A) does not remain as a residue. Therefore, after surface treatment is performed using the surface treatment composition of the present invention, it is not required to provide a process for removing a residue.

The amount of the compound (A) is preferably 0.01 to 5 parts by mass, more preferably 0.01 to 1 part by mass, and particularly preferably 0.05 to 0.5 part by mass when the whole amount of the surface treatment composition is defined as 100 parts by mass. When the amount of the compound (A) is in the range above, the surface treatment composition is excellent in reduction properties, and thus there is a tendency that a residue after treatment decreases.

<Solvent (B)>

The surface treatment composition of the present invention contains a solvent (B) having a boiling point at one atmospheric pressure is 50 to 300° C. The solvent having such a boiling point is easily removed by spin drying or heating during surface treatment or after the formation of an antioxidant coating.

Examples of the solvent (B) include water, alcohols, esters, ethers, and hydrocarbons. In particular, the use of water as the solvent (B) is more preferable in terms of the capacity of removing impurity metal ions on metal wiring. It is preferable for the solvent (B) to contain 90% by mass or more of water. The electrical conductivity of water (μS/cm; 25° C., JIS K0400-13-10: 1999) is preferably 0.0548 to 1.00 and more preferably 0.056 to 0.10. The electrical conductivity of water in the range above is preferable in terms that the capacity of removing impurity metal ions on metal wiring further improves. A lower electrical conductivity is more preferable. Examples of such water include ion exchanged water.

Specific examples of the alcohols, the esters, the ethers, and the hydrocarbons include monovalent alcohols, such as isopropanol and butanol;

divalent alcohols, such as ethylene glycol, diethylene glycol, triethylene glycol, propylene glycol, dipropyrene glycol, tripropylene glycol, butanediol, pentanediol, and hexanediol;

ethylene glycol monoalkyl ether acetates, such as ethylene glycol monomethyl ether acetate and ethylene glycol monoethyl ether acetate;

propylene glycol monoalkyl ethers, such as propylene glycol monomethyl ether, propylene glycol monoethyl ether, propylene glycol monopropyl ether, and propylene glycol monobutyl ether;

propylene glycol dialkyl ethers, such as propylene glycol dimethyl ether, propylene glycol diethylether, propylene glycol dipropyl ether, and propylene glycol dibutyl ether;

propylene glycol monoalkyl ether acetates, such as propylene glycol monomethyl ether acetate, propylene glycol monoethyl ether acetate, propylene glycol monopropyl ether acetate, and propylene glycol monobutyl ether acetate;

cellosolves, such as ethyl cellosolve and butyl cellosolve;

carbitols, such as butyl carbitol; lactic acid esters, such as methyl lactate, ethyl lactate, n-propyl lactate, and isopropyl lactate; aliphatic carboxylic acid esters, such as ethyl acetate, n-propyl acetate, isopropyl acetate, n-butyl acetate, isobutyl acetate, n-amyl acetate, isoamyl acetate, isopropyl propionate, n-butyl propionate, and isobutyl propionate;

other esters, such as 3-methoxy methyl propionate, 3-methoxy ethyl propionate, 3-ethoxy methyl propionate, 3-ethoxy ethyl propionate, methyl pyruvate, and ethyl pyruvate;

aromatic hydrocarbons, such as toluene and xylene;

ketones, such as 2-heptanon, 3-heptanone, 4-heptanone, and cyclohexanone;

amides, such as N-dimethyl formamide, N-methylacetamide, N,N-dimethylacetamide, and N-methylpyrrolidone; and lactones, such as γ-butyrolactone.

These solvents may be used singly or in combination of two or more thereof.

The amount (parts by mass) of the solvent (B) is the amount obtained by subtracting the total amount (parts by mass) of ingredients other than the solvent (B) from the whole amount (100 parts by mass) of the surface treatment composition.

The viscosity of the surface treatment composition can be adjusted by the amount of the solvent (B). As a result, an appropriate viscosity can be selected according to treatment methods using the surface treatment composition. By adjusting the viscosity, the application properties (diffusibility) during spin coating can be optimized.

<Other Ingredients>

The surface treatment composition of the present invention may contain other ingredients in addition to the compound (A) and the solvent (B). Examples of the other ingredients include organic resin particles, surface active agents, water-soluble (co)polymers (salts), surfactants, and pH adjusters. The ingredients may be used singly or in combination of two or more thereof.

Examples of the organic resin particles include particles comprising copolymers of carboxyl group-containing unsaturated monomers, polyfunctional monomers, and unsaturated monomers other than the monomers. It is preferable for the particles to contain at least one functional group selected from the group consisting of a carboxyl group, a hydroxyl group, an amino group, a sulfonic acid group, and —$N^+R_3$ (wherein, R represents a hydrogen atom or an alkyl group having 1 to 4 carbon atoms). These substances may be used singly or in combination of two or more thereof.

The organic resin particles act as a physical adsorbent. Thus, when the surface treatment composition of the present invention further contains the organic resin particles, the capacity of removing impurity metal ions on metal wiring improves, the occurrence of surface defects can be suppressed, and the expected effects of the surface treatment composition can be more effectively demonstrated.

The amount of the organic resin particles is not limited, and is preferably 0.001 to 1.00 part by mass, more preferably 0.001 to 0.10 part by mass, and particularly preferably 0.003 to 0.020 part by mass when the whole amount of the surface treatment composition is defined as 100 parts by mass.

Examples of the surface active agents include amines, amine salts of hydrochloric acid, amine salts of hydrobromic acid, and carboxylic acids and amine salts thereof. Specific examples of the surface active agents include primary amines, such as methylamine, ethylamine, n-propylamine, isopropylamine, and n-butylamine;

secondary amines, such as dimethylamine, diethylamine, di-n-propyl amine, diisopropylamine, and di-n-butylamine;

tertiary amines, such as trimethylamine, triethylamine, tri-n-propyl amine, and triisopropylamine;

alkanolamines, such as monoethanolamine, diethanolamine, and triethanolamine, and aliphatic carboxylic acids, such as oxalic acid, malonic acid, succinic acid, adipic acid, glutaric acid, diethylglutaric acid, pimelic acid, azelaic acid, sebacic acid, maleic acid, fumaric acid, diglycollic acid, capric acid, lauric acid, myristic acid, palmitic acid, linoleic acid, oleic acid, stearic acid, arachic acid, behenic acid, and linolenic acid;

aromatic acids, such as benzoic acid;

hydroxy acids, such as hydroxypivalic acid, dimethylolpropionic acid, citric acid, malic acid, glyceric acid, and lactic acid, and amine salts of these carboxylic acids.

These substances may be used singly or in combination of two or more thereof. By the use of the surface active agents, the compound (A) is coordinated to metal ions or the like, which are solubilized by the action of the surface treatment composition, and stabilized, a formed complex can be certainly removed, and the surface treatment composition of the present invention can more effectively demonstrate the expected effects.

The amount of the surface active agents is not limited, and is preferably 0.01 to 1.00 part by mass, more preferably 0.05 to 0.50 part by mass, and particularly preferably 0.05 to 0.20 part by mass when the whole amount of the surface treatment composition is defined as 100 parts by mass.

Examples of the water-soluble (co)polymers (salts) include polymers of unsaturated carboxylic acids, such as poly(meth)acrylic acid and an acrylic acid-methacrylic acid copolymer, and salts thereof; and water-soluble polymers, such as polyvinyl alcohol, polyvinyl pyrrolidone, and hydroxyethylcellulose. These substances may be used singly or in combination of two or more thereof.

By the use of the water-soluble (co)polymers (salts), the water-soluble (co)polymers (salts) adsorb to foreign substances or the like remaining on the substrate surface after chemical mechanical polishing, and the foreign substances can be dispersed in a liquid to be removed, and the expected effects of the surface treatment composition can be more effectively demonstrated.

The amount of the water-soluble (co)polymers (salts) is not limited, and is preferably 0.01 to 1.00 part by mass, more preferably 0.05 to 0.50 part by mass, and particularly preferably 0.05 to 0.20 part by mass when the whole amount of the surface treatment composition is defined as 100 parts by mass.

Examples of the surfactants include anionic surfactants or nonionic surfactants.

Specific examples of the anionic surfactants include alkyl benzene sulfonic acids, such as dodecylbenzenesulfonic acid; alkyl naphthalene sulfonic acid; alkyl sulfuric acid esters, such as lauryl sulfate; sulfuric acid esters of polyoxyethylene alkyl ether, such as polyoxyethylene lauryl sulfate; a naphthalene sulfonic acid condensate; and lignin sulfonic acid. These anionic surfactants may be used in the form of a salt.

Specific examples of the nonionic surfactants include polyoxyethylene alkyl ethers, such as polyoxyethylene lauryl ether, polyoxyethylene cetyl ether, polyoxyethylene stearyl ether, and polyoxyethylene oleyl ether; polyoxyethylene aryl ethers, such as polyoxyethylene octylphenyl ether, and polyoxyethylene nonyl phenyl ether; sorbitan fatty acid esters, such as sorbitan monolaurate, sorbitan monopalmitate, and sorbitan monostearate; and polyoxyethylene sorbitan fatty acid esters, such as polyoxyethylene sorbitan monolaurate, polyoxyethylene sorbitan monopalmitate, and polyoxyethylene sorbitan monostearate.

The surfactants may be used singly or in combination of two or more thereof. By the use of the surfactants, when a metal wiring-including surface of a semiconductor substrate is treated using the composition of the present invention, foreign substances remaining on the substrate surface can be dispersed in a liquid to be removed, and the expected effects of the surface treatment composition can be more effectively demonstrated.

The amount of the surfactants is not limited, and is preferably 0.001 to 1.00 part by mass, more preferably 0.001 to 0.10 part by mass, and particularly preferably 0.003 to 0.020 part by mass when the whole amount of the surface treatment composition is defined as 100 parts by mass.

In the surface treatment composition of the present invention, the concentration of each ingredient is in the range above in use. More specifically, as the surface treatment composition of the present invention, each ingredient may be directly blended for use in such a manner as to achieve the concentration range above. Or, a composition in a further condensed state relative to the concentration range above may be prepared, and the composition may be diluted for use by adding a solvent before use so that the concentration of each ingredient may be in the range above.

The condensed composition can be prepared by removing a solvent while maintaining the amount ratio of each ingredient other than the solvent to increase the concentration of each ingredient other than the solvent. Or, the condensed composition can also be prepared by reducing the added amount of the solvent beforehand.

In such a condensed composition, the concentration of the compound (A) is preferably 1 to 20% by mass and more preferably 1 to 10% by mass based on the whole amount of the surface treatment composition. When the concentration of the compound (A) is in the range above in the condensed composition, the surface treatment composition of the present invention can be stably stored in a condensed state. Even when diluted for use after long-term storage, the expected effects of the surface treatment composition can be demonstrated.

In the condensed composition, the concentration of the organic resin particles is preferably 30% by mass or lower and more preferably 15% by mass or lower, the concentration of the surfactant is preferably 15% by mass or lower and more preferably 10% by mass or lower, the concentration of the surface active agent is preferably 30% by mass or lower and more preferably 15% by mass or lower, and the concentration of the water-soluble (co)polymer (salt) is preferably 30% by mass or lower and more preferably 15% by mass or lower. When the concentration of each ingredient is in the range above in the condensed composition, the surface treatment composition of the present invention can be stably stored in a condensed state. Even when diluted for use after long-term storage, the expected effects of the surface treatment composition can be demonstrated.

The surface treatment composition of the present invention may contain pH adjusters as required.

Examples of the pH adjusters include inorganic acids, such as hydrochloric acid, nitric acid, sulfuric acid, and phosphoric acid; hydroxides of alkaline metals, such as sodium hydroxide, potassium hydroxide, rubidium hydroxide, and cesium hydroxide, and basic substances, such as tetra-methyl ammonium hydroxide (TMAH) and ammonia. The pH adjusters may be used singly or in combination of two or more thereof. The pH of the surface treatment composition may be adjusted in the following range using the pH adjusters.

The pH of the surface treatment composition of the present invention is 4 to 11 and preferably 4.5 to 10. The pH in the present invention is a value measured at 25° C. according to JIS K0400-12-10:2000. Due to the fact that the pH is the range above, when an insulating film or a barrier metal film is present on a metal wiring-including surface of a semiconductor substrate, fang or surface roughness of the metal wiring occurring in an interface between the metal wiring and the insulating film or the barrier metal film can be suppressed. One factor of causing the fang and surface roughness can be considered to reside in imbalance in the etching rate between the wiring metal and the insulating film or the barrier metal film. When the pH is lower than the lower limit, the fang in the interface is likely to occur, while when the pH is higher than the upper limit, the surface roughness of metal wiring is likely to occur.

The surface treatment composition of the present invention is preferably a liquid. In the case of a liquid surface treatment composition, the viscosity at one atmospheric pressure and at a temperature of 23° C., for example, is preferably 0.001 to 1000 Pa·S, more preferably 0.01 to 800 Pa·S, and still more preferably 0.1 to 700 Pa·S. The surface treatment composition of the present invention may be a gas or a supercritical fluid insofar as the objects of the present invention can be achieved.

The surface treatment composition of the present invention having the above-described composition demonstrates both the effects, which are obtained by the compound (A), of removing oxides of metal wiring of a semiconductor substrate by dissolving and reducing oxides on the metal wiring surface to remove the oxygen. Furthermore, since an antioxidant coating at a molecular level is formed on the metal wiring surface after surface treatment, the action is demonstrated that prevents the metal wiring of the semiconductor substrate from being oxidized again after surface treatment. Therefore, the progress of oxidation can be suppressed even when the semiconductor substrate after surface treatment is exposed to the atmosphere for one week or more. Furthermore, the antioxidant coating to be formed on the metal wiring surface after surface treatment evaporates by heating, and thus can be simply removed. The heating temperature is, for example, 50 to 300° C. and more preferably 100 to 200° C. Even when metal oxides remain after the treatment by the surface treatment composition of the present invention, the metal wiring surface can be cleaned again because a reduction action is also simultaneously demonstrated by heating.

When an insulating film or a barrier metal film is present on a metal wiring-including surface of a semiconductor substrate, the surface treatment composition having a pH in the range above demonstrates the effect of suppressing fang and surface roughness of the metal wiring occurring in the interface between the metal wiring and the insulating film or the barrier metal film.

The surface treatment composition of the present invention can be prepared by mixing the respective ingredients.

[2. Surface Treatment Method]

The surface treatment method of the present invention comprises bringing the surface treatment composition into contact with a metal wiring-including surface of a semiconductor substrate to treat the metal wiring-including surface of the semiconductor substrate. The surface treatment method of the present invention can be applied to treatment of a semiconductor substrate having a metal wiring-including surface and is preferable as a surface treatment method for a semiconductor substrate in which an insulating film having a channel for forming a metal wiring portion is deposited on a base comprising silicon or the like, a barrier metal film is deposited on the insulating film, and a metal wiring material is deposited on the barrier metal film. FIG. 1B shows an example of the cross sectional view of the semiconductor substrate. FIG. 1(b) is a cross sectional view of a substrate 1 shown in FIG. 1(a) after chemical mechanical polishing. The substrate 1 shown in FIG. 1(a) comprises a base 11 formed of silicon, for example, an insulating film 12, a barrier metal film 13, and a metal film 14 forming a wiring portion.

The treatment target to which the surface treatment method of the present invention can be applied is a surface including metal wiring of copper or the like of a semiconductor substrate. The interface between wiring metal present in such a metal wiring-including surface of the semiconductor substrate and the insulating film or the barrier metal film is generally easily corroded to easily cause a wedge-shaped defect (fang). However, by performing the surface treatment method using the surface treatment composition of the present invention, the occurrence of fang can be suppressed, and thus a favorable surface state can be maintained.

The surface treatment method of the present invention is not limited insofar as the surface treatment composition can be brought into contact with a metal wiring-including surface of a semiconductor substrate, and such a contacting method is not limited.

The contacting method can be carried out by known former surface treatment methods, such as surface plate treatment, brush scrubbing treatment, and roll treatment, except using the surface treatment composition of the present invention. Moreover, a so-called spin coating, in which the surface treatment composition is supplied during rotation of a spin-rinse-dry unit or the like. The method can also be carried out by supplying the surface treatment composition in processes after surface treatment and before drying.

The surface treatment by the surface plate treatment refers to, for example, a method comprising supplying a slurry (aqueous dispersion for chemical mechanical polishing) on a surface plate (e.g., polishing pad), then supplying a surface treatment composition and, as required, ion exchanged water (hereinafter also referred to as "DIW"), and treating the substrate surface while rotating the surface plate and the substrate.

The surface treatment method by brush scrubbing treatment and roll treatment refers to, for example, a method for treating a substrate surface comprising supplying ion exchanged water (hereinafter also referred to as "DIW") or a surface treatment composition while rotating a sponge brush formed of soft materials (polyvinyl alcohol (PVA) or the like) on both the substrate surfaces and, simultaneously therewith, horizontally rotating the substrate to treat the substrate surface.

The treatment method by spin coating refers to, for example, a method for treating a substrate surface comprising supplying a surface treatment composition before supplying a DIW rinse while rotating in a spin-rinse-dry unit to treat the substrate surface.

According to the surface treatment method of the present invention, oxidation of metal wiring of a semiconductor substrate can be suppressed and furthermore, when an insulating film or a barrier metal film is present on a metal wiring-including surface of a semiconductor substrate, fang and surface roughness of the metal wiring occurring in an interface between the metal wiring and the insulating film or the barrier metal film can be suppressed.

[3. Method for Manufacturing a Semiconductor Device]

The method for manufacturing a semiconductor device of the present invention comprises a process for treating a metal wiring-including surface of a semiconductor substrate by the surface treatment method. For other processes, former known processes can be applied.

The process for treating a metal wiring-including surface of a semiconductor substrate by the surface treatment method is preferably carried out after chemical mechanical polishing of the semiconductor substrate. The process for treating by the surface treatment method may be carried out, for example, by a former known surface treatment, such as surface plate treatment, brush scrubbing treatment, and roll treatment, or by a surface treatment by spin coating after chemical mechanical polishing of the semiconductor substrate, may be carried out during a period after the former known surface treatment and before a drying process, or may be carried out after a drying process.

By performing the process for treating a metal wiring-including surface of a semiconductor substrate by the surface treatment method, oxidation of the metal wiring of the semiconductor substrate can be suppressed, and a reduction process in the following process can be considerably simplified. Therefore, according to the method for manufacturing a semiconductor device of the present invention, semiconductor devices can be manufactured while saving the cost.

Moreover, according to the method for manufacturing a semiconductor device of the present invention, deterioration of the flatness of the metal wiring portion due to unusual oxidation can be suppressed. Furthermore, when an insulating film or a barrier metal film is present on a metal wiring-including surface of a semiconductor substrate, fang and surface roughness of the metal wiring occurring in the interface with the metal wiring and the insulating film or the barrier metal film can be suppressed. Therefore, the semiconductor device obtained by the method for manufacturing a semiconductor device of the present invention is excellent in electrical properties.

EXAMPLES

Hereinafter, the present invention will be specifically described with reference to Examples, but is not limited to the Examples.

[Preparation of Organic Resin Particle-Containing Water Dispersion]

In a flask were put 8 parts by mass of methacrylic acid, 20 parts by mass of divinylbenzene, and 72 parts by mass of styrene as a monomer, 0.5 part by mass of ammonium persulfate as a polymerization initiator, 9 parts by mass of sodium dodecylbenzenesulfonate as a surfactant, and 400 parts by mass of ion exchanged water as a solvent. The temperature was increased to 70° C. while stirring under a nitrogen atmosphere, and stirring was further performed at the same temperature for 8 hours for polymerization. Thus, obtained was a water dispersion that contains organic resin particles having a carboxyl group and a cross-linking structure and having an average dispersed particle diameter of 50 nm (hereinafter also referred to as "organic resin particles c1"). Ion exchanged water was added to the water dispersion, thereby preparing an organic resin particles-containing water dispersion (CW) having a content of the organic resin particles of 17% by mass.

Example 1

(i) Preparation of Surface Treatment Composition

In a polyethylene container were put 0.1 part by mass of 2-pyridine carboxy aldehyde as the compound (A), 0.1 part by mass of citric acid as a surface active agent, 0.1 part by mass of polyacrylic acid as a water-soluble (co)polymer (salt), and 0.007 part by mass of dodecylbenzenesulfonic acid as a surfactant, and the organic resin particles-containing water dispersion (CW) prepared above were put therein so that the amount of the organic resin particles c1 was 0.01 part by mass. Next, ion exchanged water was added as the solvent (B) so that the total amount of all the ingredients was 100 parts by mass, and the mixture was stirred for 15 minutes. Next, the pH of the mixture was adjusted using tetramethyl ammonium hydroxide (hereinafter also referred to as "TMAH") as a pH adjuster. Thereafter, the resultant was filtered with a filter having a pore size of 5 μm, thereby obtaining a surface treatment composition (1) having a pH of 4.5. The pH of the surface treatment composition was measured using a pH meter "F52" manufactured by Horiba, Ltd. The measurement results are shown in Table 1.

(ii) Chemical Mechanical Polishing of Substrate Having Copper Wiring Pattern

A substrate having a copper wiring pattern (manufactured by International SEMATECH, Test substrate (hereinafter also referred to as "SEMATECH 854") in which a PETEOS film was laminated with a thickness of 5000 Å on a silicon substrate, pattern processing was carried out with a "SEMATECH 854" mask, and a 250 Å thick TiN film, a 1,000 Å copper seed film, and a 10,000 Å thick copper plating film were successively laminated thereon) was subjected to two-stage chemical mechanical polishing using a chemical mechanical polishing device "EPO112" (manufactured by Ebara Corporation).

(First-Stage Chemical Mechanical Polishing)

Chemical mechanical polishing aqueous dispersion: "CMS7501/CMS7552" manufactured by JSR Polishing pad: "IC1000/SUBA400" manufactured by RODEL NITTA COMPANY Number of rotations of surface plate: 70 rpm Number of rotations of head: 70 rpm Head load: 50 g/cm$^2$ Polishing aqueous dispersion supply rate: 200 mL/minute Polishing time: 150 seconds (Second-Stage Chemical Mechanical Polishing)

Chemical mechanical polishing aqueous dispersion: "CMS8501/CMS8552" manufactured by JSR Polishing pad: "IC1000/SUBA400" manufactured by RODEL NITTA COMPANY Number of rotations of surface plate: 70 rpm Number of rotations of head: 70 rpm Head load: 250 g/cm$^2$ Polishing aqueous dispersion supply rate: 200 mL/minute Polishing time: 60 seconds (iii) Surface Treatment Subsequent to chemical mechanical polishing of (ii) above, the surface treatment composition (1) prepared in (i) above was brought into contact with a copper wiring-including surface of the substrate after polishing. In detail, in a surface plate washing process and a brush scrub washing process under the following conditions, the surface treatment composition (1) was supplied in place of a common detergent, and the composition was brought into contact with the metal wiring-including surface of the semiconductor substrate. Thereafter, by a spin-rinse-dry unit, ion exchanged water (hereinafter also referred to as "DIW") was supplied to the copper wiring-including surface of the substrate, and surface treatment was performed under the following conditions.

(Surface Plate Washing Process)

Number of rotations of head: 70 rpm

Head load: 100 g/cm$^2$

Number of rotations of surface plate: 70 rpm

Surface treatment composition supply rate: 300 mL/minute

Surface treatment time: 30 seconds (Brush Scrub Washing Process)

Number of rotations of upper brush: 100 rpm

Number of rotations of lower brush: 100 rpm

Number of rotations of substrate: 100 rpm

Surface treatment composition supply amount: 300 mL/minute

Surface treatment time: 30 seconds (Spin-Rinse-Dry Treatment)

Number of rotations of substrate: 100 rpm

Surface treatment composition supply amount: 300 mL/minute

Surface treatment time: 60 seconds (iv) Evaluation of Substrate Surface

The entire substrate surface after the surface treatment of (iii) above was observed for scratch defects, minute foreign substance defects, wedge-shaped corrosion defects (fang), and surface roughness using a wafer surface foreign substance inspection device "KLA2351" manufactured by KLA Tencor corporation and a defect review SEM "SEMVision G3 FIB" manufactured by Applied Materials. The results are shown in Table 2.

Considering the influence on the following process, the case where the number of the scratch defects, the minute foreign substance defects, and the wedge-shaped corrosion defects (fang) in the entire substrate surface (diameter: 8 in.) was lower than 100 was evaluated to be favorable and the case where the number thereof was 100 or more was evaluated to be bad. The case where the surface roughness was observed even in one portion was evaluated to be bad.

(v) Confirmation of Unusual Oxidation

The substrate after the surface treatment of (iii) above was allowed to stand still for three days in a high temperature and high humidity state of a temperature of 40° C. and a humidity of 100%. Thereafter, the presence of unusual oxidation in copper wiring (10 μm×10 μm) was observed using an atomic force microscope "NanoScope IIIa" manufactured by Digital Instruments (currently, Veeco Instruments). The results are shown in Table 2. When a convex portion having a height of 10 nm or higher was present even in one portion of copper wiring, it was considered that unusual oxidation occurred.

(vi) Copper Oxide Film Thickness Measurement

Substrate surface treatment was performed by immersing a substrate with a copper thin film having no wiring pattern (manufactured by ATDF, 8 inch, Cu plating 15,000 Å) in the surface treatment composition (1) prepared by (i) above for 60 seconds, and washing the same with water for 30 seconds. The copper oxide film thickness after the surface treatment was measured by a CV method using an electrochemical measurement system HZ-3000 manufactured by Hokuto Denko Corporation. The results are shown in Table 2.

The film thickness of the copper oxide naturally formed during standby, measurement, or the like was assumed to be 20 to 30 Å from various literatures and the like. Then, the case where the copper oxide film thickness after surface treatment was 30 Å or lower was evaluated to be favorable and the case where the film thickness exceeded 30 Å was evaluated to be bad considering the influence on a reduction process in the following process after the surface treatment.

Example 2

(i) Preparation of Surface Treatment Composition

A surface treatment composition (2) was obtained in the same manner as in Example 1, except that maleic acid was used as a surface active agent and the pH was adjusted to 6.2 using a pH adjuster (TMAH).

(ii) Chemical Mechanical Polishing of Substrate Having Copper Wiring Pattern

A substrate having a copper wiring pattern "SEMATECH 854" was subjected to two-stage chemical mechanical polishing using a chemical mechanical polishing device "EPO112" (manufactured by Ebara Corporation) in the same manner as in Example 1.

(iii) Surface Treatment and Evaluation

Surface treatment was performed in the same manner as in Example 1, except using the surface treatment composition (2) in place of the surface treatment composition (1), and the evaluation of the substrate surface, confirmation of unusual oxidation, and copper oxide film thickness measurement were performed. The results are shown in Table 2.

Example 3

(i) Preparation of Surface Treatment Composition

A surface treatment composition (3) was obtained in the same manner as in Example 1, except that maleic acid was used as a surface active agent and the pH was adjusted to 10.0 using a pH adjuster (TMAH).

(ii) Chemical Mechanical Polishing of Substrate Having Copper Wiring Pattern

A substrate having a copper wiring pattern "SEMATECH 854" was subjected to two-stage chemical mechanical polishing using a chemical mechanical polishing device "EPO112" (manufactured by Ebara Corporation) in the same manner as in Example 1.

(iii) Surface Treatment and Evaluation

Surface treatment was performed in the same manner as in Example 1, except using the surface treatment composition (3) in place of the surface treatment composition (1), and the evaluation of the substrate surface, confirmation of unusual oxidation, and copper oxide film thickness measurement were performed. The results are shown in Table 2.

Example 4

(i) Preparation of Surface Treatment Composition

A surface treatment composition (4) was obtained in the same manner as in Example 1, except that surface active agents, water-soluble (co)polymers (salts), and surfactants were not used, the amount of the compound (A) was adjusted to 0.3 part by mass, and the pH was adjusted to 6.2 using a pH adjuster (TMAH).

(ii) Chemical Mechanical Polishing of Substrate Having Copper Wiring Pattern

A substrate having a copper wiring pattern "SEMATECH 854" was subjected to two-stage chemical mechanical polishing using a chemical mechanical polishing device "EPO112" (manufactured by Ebara Corporation) in the same manner as in Example 1.

(iii) Surface Treatment and Evaluation

Su/face treatment was performed in the same manner as in Example 1, except using the surface treatment composition (4) in place of the surface treatment composition (1), and the evaluation of the substrate surface, confirmation of unusual oxidation, and copper oxide film thickness measurement were performed. The results are shown in Table 2.

Example 5

(i) Preparation of Surface Treatment Composition

A surface treatment composition (5) having a pH of 6.2 was obtained in the same manner as in Example 1, except that surface active agents, water-soluble (co)polymers (salts), organic resin particles, surfactants, and pH adjusters were not used and the amount of the compound (A) was adjusted to 0.3 part by mass.

(ii) Chemical Mechanical Polishing of Substrate Having Copper Wiring Pattern

A substrate having a copper wiring pattern "SEMATECH 854" was subjected to two-stage chemical mechanical polishing using a chemical mechanical polishing device "EPO112" (manufactured by Ebara Corporation) in the same manner as in Example 1.

(iii) Surface Treatment and Evaluation

Surface treatment was performed in the same manner as in Example 1, except using the surface treatment composition (5) in place of the surface treatment composition (1), and the evaluation of the substrate surface, confirmation of unusual oxidation, and copper oxide film thickness measurement were performed. The results are shown in Table 2.

Comparative Example 1

A surface treatment composition (6) was obtained in the same manner as in Example 1, except that the pH was adjusted to 3.0 using a pH adjuster (TMAH).

(ii) Chemical Mechanical Polishing of Substrate Having Copper Wiring Pattern

A substrate having a copper wiring pattern "SEMATECH 854" was subjected to two-stage chemical mechanical polishing using a chemical mechanical polishing device "EPO112" (manufactured by Ebara Corporation) in the same manner as in Example 1.

(iii) Surface Treatment and Evaluation

Surface treatment was performed in the same manner as in Example 1, except using the surface treatment composition (6) in place of the surface treatment composition (1), and the evaluation of the substrate surface, confirmation of unusual oxidation, and copper oxide film thickness measurement were performed. The results are shown in Table 3.

Comparative Example 2

(i) Preparation of Surface Treatment Composition

A surface treatment composition (7) was obtained in the same manner as in Example 1, except that the pH was adjusted to 12.0 using a pH adjuster (TMAH).

(ii) Chemical Mechanical Polishing of Substrate Having Copper Wiring Pattern

A substrate having a copper wiring pattern "SEMATECH 854" was subjected to two-stage chemical mechanical polishing using a chemical mechanical polishing device "EPO112" (manufactured by Ebara Corporation) in the same manner as in Example 1.

(iii) Surface Treatment and Evaluation

Surface treatment was performed in the same manner as in Example 1, except using the surface treatment composition (7) in place of the surface treatment composition (1), and the evaluation of the substrate surface, confirmation of unusual oxidation, and copper oxide film thickness measurement were performed. The results are shown in Table 3.

Comparative Example 3

(i) Preparation of Surface Treatment Composition

A surface treatment composition (8) was obtained in the same manner as in Example 1, except not using the compound (A).

(ii) Chemical Mechanical Polishing of Substrate Having Copper Wiring Pattern

A substrate having a copper wiring pattern "SEMATECH 854" was subjected to two-stage chemical mechanical polishing using a chemical mechanical polishing device "EPO112" (manufactured by Ebara Corporation) in the same manner as in Example 1.

(iii) Surface Treatment and Evaluation

Surface treatment was performed in the same manner as in Example 1, except using the surface treatment composition (8) in place of the surface treatment composition (1), and the evaluation of the substrate surface, confirmation of unusual oxidation, and copper oxide film thickness measurement were performed. The results are shown in Table 3. Unusual oxidation of copper wiring occurred at nine portions.

Comparative Example 4

(i) Preparation of Surface Treatment Composition

A surface treatment composition (9) was obtained in the same manner as in Example 2, except not using the compound (A).

(ii) Chemical Mechanical Polishing of Substrate Having Copper Wiring Pattern

A substrate having a copper wiring pattern "SEMATECH 854" was subjected to two-stage chemical mechanical polishing using a chemical mechanical polishing device "EPO112" (manufactured by Ebara Corporation) in the same manner as in Example 1.

(iii) Surface Treatment and Evaluation

Surface treatment was performed in the same manner as in Example 1, except using the surface treatment composition (9) in place of the surface treatment composition (1), and the evaluation of the substrate surface, confirmation of unusual oxidation, and copper oxide film thickness measurement were performed. The results are shown in Table 3. Unusual oxidation of copper wiring occurred at six portions.

Comparative Example 5

(i) Preparation of Surface Treatment Composition

A surface treatment composition (10) was obtained in the same manner as in Example 3, except not using the compound (A).

(ii) Chemical Mechanical Polishing of Substrate Having Copper Wiring Pattern

A substrate having a copper wiring pattern "SEMATECH 854" was subjected to two-stage chemical mechanical polishing using a chemical mechanical polishing device "EPO112" (manufactured by Ebara Corporation) in the same manner as in Example 1.

(iii) Surface Treatment and Evaluation

Surface treatment was performed in the same manner as in Example 1, except using the surface treatment composition (10) in place of the surface treatment composition (1), and the evaluation of the substrate surface, confirmation of unusual oxidation, and copper oxide film thickness measurement were performed. The results are shown in Table 3. Unusual oxidation of copper wiring occurred at three portions.

Example 6

Surface treatment was performed in the same manner as in Example 1, except using the surface treatment composition (8) in place of the surface treatment composition (1) and using the surface treatment composition (5) in place of DIW, and the evaluation of the substrate surface, confirmation of unusual oxidation, and copper oxide film thickness measurement were performed. The results are shown in Table 2.

Example 7

Surface treatment was performed in the same manner as in Example 1, except using the surface treatment composition (9) in place of the surface treatment composition (1) and using the surface treatment composition (5) in place of DIW, and the evaluation of the substrate surface, confirmation of unusual oxidation, and copper oxide film thickness measurement were performed. The results are shown in Table 2.

Example 8

Surface treatment was performed in the same manner as in Example 1, except using the surface treatment composition (10) in place of the surface treatment composition (1) and using the surface treatment composition (5) in place of DIW, and the evaluation of the substrate surface, confirmation of unusual oxidation, and copper oxide film thickness measurement were performed. The results are shown in Table 2.

Comparative Example 6

(i) Preparation of Surface Treatment Composition

A surface treatment composition (11) was obtained in the same manner as in Example 1, except that surface active agents, water-soluble (co)polymers (salts), organic resin particles, and surfactants were not used, the amount of the compound (A) was adjusted to 0.3 part by mass, and the pH was adjusted to 3.0 using a pH adjuster (phosphoric acid).

(ii) Surface Treatment and Evaluation

Surface treatment was performed in the same manner as in Example 1, except using the surface treatment composition (9) in place of the surface treatment composition (1) and using the surface treatment composition (11) in place of DIW, and the evaluation of the substrate surface, confirmation of unusual oxidation, and copper oxide film thickness measurement were performed. The results are shown in Table 3. Unusual oxidation of copper wiring occurred at two portions.

Comparative Example 7

(i) Preparation of Surface Treatment Composition

A surface treatment composition (12) was obtained in the same manner as in Example 1, except that surface active agents, water-soluble (co)polymers (salts), organic resin particles, and surfactants were not used, the amount of the compound (A) was adjusted to 0.3 part by mass, and the pH was adjusted to 12.0 using a pH adjuster (TMAH).

(ii) Surface Treatment and Evaluation

Surface treatment was performed in the same manner as in Example 1, except using the surface treatment composition (9) in place of the surface treatment composition (1) and using the surface treatment composition (12) in place of DIW, and the evaluation of the substrate surface, confirmation of unusual oxidation, and copper oxide film thickness measurement were performed. The results are shown in Table 3.

TABLE 1

| | | Composition (1) | Composition (2) | Composition (3) | Composition (4) | Composition (5) | Composition (6) |
|---|---|---|---|---|---|---|---|
| Compound (A) | Type | 2-pyridine-carboxy-aldehyde | 2-pyridine-carboxy-aldehyde | 2-pyridine-carboxy-aldehyde | 2-pyridine-carboxy-aldehyde | 2-pyridine-carboxy-aldehyde | 2-pyridine-carboxy-aldehyde |
| | Amount (part by mass) | 0.1 | 0.1 | 0.1 | 0.3 | 0.3 | 0.1 |
| Surface active agent | Type | Citric acid | Maleic acid | Maleic acid | | | Citric acid |
| | Amount (part by mass) | 0.1 | 0.1 | 0.1 | | | 0.1 |
| Water-soluble (co)polymer (salt) | Type | Polyacrylic acid | Polyacrylic acid | Polyacrylic acid | | | Polyacrylic acid |
| | Amount (part by mass) | 0.1 | 0.1 | 0.1 | | | 0.1 |
| Organic resin particles | Type | c1 | c1 | c1 | c1 | | c1 |
| | Amount (part by mass) | 0.01 | 0.01 | 0.01 | 0.01 | | 0.01 |
| Surfactant | Type | Dodecyl-benzene sulfonic acid | Dodecyl-benzene sulfonic acid | Dodecyl-benzene sulfonic acid | | | Dodecyl-benzene sulfonic acid |
| | Amount (part by mass) | 0.007 | 0.007 | 0.007 | | | 0.007 |

TABLE 1-continued

| pH | pH adjuster | TMAH | TMAH | TMAH | TMAH | | TMAH |
| --- | --- | --- | --- | --- | --- | --- | --- |
| | pH | 4.5 | 6.2 | 10.0 | 6.2 | 6.2 | 3.0 |

| | | Composition (7) | Composition (8) | Composition (9) | Composition (10) | Composition (11) | Composition (12) |
| --- | --- | --- | --- | --- | --- | --- | --- |
| Compound (A) | Type | 2-pyridine-carboxyaldehyde | | | | 2-pyridine-carboxyaldehyde | 2-pyridine-carboxyaldehyde |
| | Amount (part by mass) | 0.1 | | | | 0.3 | 0.3 |
| Surface active agent | Type | Citric acid | Citric acid | Maleic acid | Maleic acid | | |
| | Amount (part by mass) | 0.1 | 0.1 | 0.1 | 0.1 | | |
| Water-soluble (co)polymer (salt) | Type | Polyacrylic acid | Polyacrylic acid | Polyacrylic acid | Polyacrylic acid | | |
| | Amount (part by mass) | 0.1 | 0.1 | 0.1 | 0.1 | | |
| Organic resin particles | Type | c1 | c1 | c1 | c1 | | |
| | Amount (part by mass) | 0.01 | 0.01 | 0.01 | 0.01 | | |
| Surfactant | Type | Dodecylbenzene sulfonic acid | Dodecylbenzene sulfonic acid | Dodecylbenzene sulfonic acid | Dodecylbenzene sulfonic acid | | |
| | Amount (part by mass) | 0.007 | 0.007 | 0.007 | 0.007 | | |
| pH | pH adjuster | TMAH | TMAH | TMAH | TMAH | phosphoric acid | TMAH |
| | pH | 12.0 | 4.5 | 6.2 | 10.0 | 3.0 | 12.0 |

TABLE 2

| | | Ex. 1 | Ex. 2 | Ex. 3 | Ex. 4 | Ex. 5 |
| --- | --- | --- | --- | --- | --- | --- |
| Surface treatment process | Surface plate treatment and brush scrubbing treatment | Composition (1) | Composition (2) | Composition (3) | Composition (4) | Composition (5) |
| | Spin-rinse-dry treatment | DIW | DIW | DIW | DIW | DIW |
| Evaluation items | Number of scratch defects (pieces/wafer) | 36 | 41 | 68 | 51 | 88 |
| | Number of minute foreign substance defect (pieces/wafer) | 20 | 25 | 41 | 46 | 82 |
| | Number of wedge-shaped corrosion defects | 18 | 23 | 27 | 11 | 24 |
| | Surface roughness (presence) | None | None | None | None | None |
| | Unusual oxidation (presence) | None | None | None | None | None |
| | Film thickness of oxide film (Å) | 26.4 | 21.3 | 28.7 | 23.4 | 26.7 |

| | | Ex. 6 | Ex. 7 | Ex. 8 |
| --- | --- | --- | --- | --- |
| Surface treatment process | Surface plate treatment and brush scrubbing treatment | Composition (8) | Composition (9) | Composition (10) |
| | Spin-rinse-dry treatment | Composition (5) | Composition (5) | Composition (5) |
| Evaluation items | Number of scratch defects (pieces/wafer) | 29 | 37 | 72 |
| | Number of minute foreign substance defect (pieces/wafer) | 11 | 14 | 43 |
| | Number of wedge-shaped corrosion defects | 18 | 23 | 17 |
| | Surface roughness (presence) | None | None | None |

TABLE 2-continued

| | | | |
|---|---|---|---|
| Unusual oxidation (presence) | None | None | None |
| Film thickness of oxide film (Å) | 25.7 | 22.2 | 24.9 |

TABLE 3

| | | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|---|
| Surface treatment process | Surface plate treatment and brush scrubbing treatment | Composition (6) | Composition (7) | Composition (8) | Composition (9) | Composition (10) | Composition (9) | Composition (9) |
| | Spin-rinse-dry treatment | DIW | DIW | DIW | DIW | DIW | Composition (11) | Composition (12) |
| Evaluation items | Number of scratch defects (pieces/wafer) | 42 | 162 | 40 | 41 | 82 | 40 | 38 |
| | Number of minute foreign substance defect (pieces/wafer) | 20 | 329 | 12 | 25 | 53 | 15 | 28 |
| | Number of wedge-shaped corrosion defects | 128 | 20 | 39 | 22 | 14 | 147 | 25 |
| | Surface roughness (presence) | None | Present | None | None | None | None | Present |
| | Unusual oxidation (presence) | None | None | Present | Present | Present | Present | None |
| | Film thickness of oxide film (Å) | 26.8 | 24.0 | 78.2 | 23.1 | 28.9 | 60.2 | 27.5 |

As described above, the results of Examples 1 to 8 and Comparative Examples 1 to 7 have showed that, according to the treatment (Comparative Examples 3 to 5) using former known surface treatment compositions, it has been difficult to suppress the occurrence of both surface defects and unusual oxidation, but, according to the treatment (Examples 1 to 8) using the surface treatment composition containing the compound (A) for use in the present invention, unusual oxidation during standby can also be suppressed while suppressing the occurrence of surface defects. Moreover, even in the case of the surface treatment compositions containing the compound (A) as in Comparative Examples 1, 2, 6 and 7, when the pH of the composition is outside the range of the present invention, it has been difficult to suppress the occurrence of both surface defects and unusual oxidation.

What is claimed is:

1. A surface treatment method, comprising:
    bringing a surface treatment composition into contact with a metal wiring-including surface of a semiconductor substrate, which has been chemically-mechanically polished, to treat the metal wiring-including surface of the semiconductor substrate, the surface treatment composition comprising a compound (A) represented by the following Formula (1) and a solvent (B) having a boiling point at one atmospheric pressure of 50 to 300° C., and has a pH of 4 to 11,

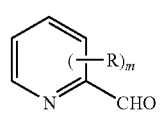

(1)

wherein Rs each independently represent an alkyl group, an aryl group, an alkoxy group, an amino group, an amino alkyl group, a hydroxy group, a hydroxyalkyl group, a carboxy group, a carboxyalkyl group, a carbamoyl group, or an aldehyde group and m is an integer of 0 to 4.

2. The surface treatment method according to claim 1, wherein the surface treatment composition further comprises organic resin particles.

3. The surface treatment method according to claim 1, wherein the solvent (B) is water.

4. The surface treatment method according to claim 2, wherein the solvent (B) is water.

5. A method for manufacturing a semiconductor device, comprising:
    treating a metal wiring-including surface of a semiconductor substrate, which has been chemically-mechanically polished, by the surface treatment method according to claim 1.

6. The method for manufacturing a semiconductor device according to claim 5, wherein the surface treatment composition further comprises organic resin particles.

7. The method for manufacturing a semiconductor device according to claim 5, wherein the solvent (B) is water.

8. The method for manufacturing a semiconductor device according to claim 6, wherein the solvent (B) is water.

9. The method for manufacturing a semiconductor device according to claim 5, further comprising:
    chemically-mechanically polishing the semiconductor substrate before treating the metal wiring-including surface of the semiconductor substrate.

10. The method according to claim 1, wherein the surface treatment composition has a water-soluble component and a water-insoluble component, wherein the water-soluble component comprises compound (A) and the water-insoluble component consists of organic resin particles.

11. The method according to claim 10, wherein the water-soluble component further comprises water, a surface active agent, and a pH adjuster.

12. The surface treatment method according to claim 1, wherein the surface treatment composition is contacted with the metal wiring-including surface of the semiconductor substrate without chemical mechanical polishing of the metal wiring-including surface of the semiconductor substrate during the contacting.

13. The surface treatment method according to claim 1, wherein the surface treatment composition further comprises resin particles which physically adsorb impurity metal ions from the metal wiring-including surface of the semiconductor substrate during the contacting.

* * * * *